US008557646B2

(12) United States Patent
Chen et al.

(10) Patent No.: US 8,557,646 B2
(45) Date of Patent: Oct. 15, 2013

(54) METHOD FOR FABRICATING A VERTICAL TRANSISTOR

(75) Inventors: Meng-Hsien Chen, Taichung (TW); Chung-Yung Ai, Taichung (TW); Chih-Wei Hsiung, Taichung (TW)

(73) Assignee: Rexchip Electronics Corporation, Taichung (TW)

( * ) Notice: Subject to any disclaimer, the term of this patent is extended or adjusted under 35 U.S.C. 154(b) by 75 days.

(21) Appl. No.: 13/410,102

(22) Filed: Mar. 1, 2012

(65) Prior Publication Data

US 2013/0230955 A1    Sep. 5, 2013

(51) Int. Cl.
*H01L 29/732* (2006.01)

(52) U.S. Cl.
USPC .................................................. 438/192

(58) Field of Classification Search
USPC ............................................. 438/192
See application file for complete search history.

(56) References Cited

U.S. PATENT DOCUMENTS

| 7,524,725 | B2 | 4/2009 | Chung |
| 2006/0258086 | A1 | 11/2006 | Manning |
| 2012/0119286 | A1* | 5/2012 | Kim et al. ............. 257/329 |
| 2013/0153990 | A1* | 6/2013 | Lee et al. ............. 257/329 |

* cited by examiner

*Primary Examiner* — Zandra Smith
*Assistant Examiner* — Pamela E Perkins
(74) *Attorney, Agent, or Firm* — Muncy, Geissler, Olds & Lowe, PLLC

(57) ABSTRACT

A method for fabricating a vertical transistor comprises steps: forming a plurality of first trenches in a substrate; sequentially epitaxially growing a first polarity layer and a channel layer inside the first trenches, and forming a first retard layer on the channel layer; etching the first retard layer and the channel layer along the direction vertical to the first trenches to form a plurality of pillars; respectively forming a gate on a first sidewall and a second sidewall of each pillar; removing the first retard layer on the pillar; and epitaxially growing a second polarity layer on the pillar. The present invention is characterized by using an epitaxial method to form the first polarity layer, the channel layer and the second polarity layer and has the advantage of uniform ion concentration distribution. Therefore, the present invention can fabricate a high-quality vertical transistor.

13 Claims, 20 Drawing Sheets

METHOD FOR FABRICATING A VERTICAL TRANSISTOR

FIELD OF THE INVENTION

The present invention relates to a method for fabricating a transistor, particularly to a method for fabricating a vertical transistor.

BACKGROUND OF THE INVENTION

The advance of semiconductor technology not only effectively reduces the size of electronic elements but also obviously decreases the fabrication cost of electronic products. For many years, the semiconductor technology was limited to fabricate planar semiconductor structure via etching, ion implantation, wiring, etc. The smallest chip has been as small as 6F2 so far. However, the technical advance in reducing the feature size has been gradually slowed down, and it is hard to further prominently reduce the area occupied by a chip in a wafer. On the other side, the vertical (also called as three-dimensional) semiconductor technology is growing mature, wherein the semiconductor elements are vertically grown on a wafer to reduce the area occupied by a transistor in the wafer and reduce the chip size to as small as 4F2.

For examples, a U.S. Pat. No. 7,524,725 disclosed a "Vertical Transistor of Semiconductor Device and Method for Forming the Same", and a U.S. Pat. Pub. No. 2006/0258086 disclosed "Methods of Forming Vertical Transistor Structures". In the abovementioned prior arts, a silicon substrate is etched to form a plurality of pillars, and ion-implanted regions are formed on the pillars via an ion-doping method or a diffusion method, respectively functioning as the sources, the channels and the drains. Refer to FIG. 1 schematically showing the ion distributions of a source region 1, a channel region 2 and a drain region 3. Limited by the ion-implant technology, the ion concentration 4 of the channel region 2 is not uniform but in a Gaussian distribution along the vertical direction, wherein the ion concentration 4 of the channel region 2 vary in different depth. In such a case, the ion concentration 4 may respectively overlap the ion concentration 5 of the source region and the ion concentration 6 of the drain region and form a high-concentration overlap section 7 and a low-concentration overlap section 8. Such a phenomenon may results in leakage current or conduction failure and affects the quality of vertical transistors.

SUMMARY OF THE PRESENT INVENTION

The primary objective of the present invention is to overcome the problem of uneven ion concentration distribution occurring in the conventional vertical transistor.

To achieve the abovementioned objective, the present invention proposes a method for fabricating a vertical transistor, which comprises the steps of:

Step S1: defining at least one trench region and at least one insulation region in a substrate, and forming a first trench in each trench region;

Step S2: sequentially epitaxially growing a first polarity layer and a channel layer inside each first trench, and forming a first retard layer on the channel layer;

Step S3: etching the insulation region with the first retard layer being a mask until the top of the insulation region is lower than the top of the first polarity layer by an etch depth so as to form a connection portion connected with the polarity layer and defining a combination of the connection portion, the first polarity layer, the channel layer and the first retard layer which stack together as an integration layer, wherein the integration layer has two opposite side faces;

Step S4: forming a first insulation layer on each side face;

Step S5: forming a plurality of second trenches in the integration layers to form at least one pillar each having a first sidewall and a second sidewall, wherein the integration layer is etched until the channel layer is completely removed with the first polarity layer being preserved to form the second trenches, and wherein a lengthwise direction of the second trenches is vertical to that of the first trenches;

Step S6: respectively forming a gate on the first sidewall and the second sidewall;

Step S7: removing the first retard layer on the pillar; and

Step S8: epitaxially growing a second polarity layer on the pillar.

The present invention is characterized by using an epitaxial method to form the first polarity layer, the channel layer and the second polarity layer and has the advantage of uniform ion distribution. Therefore, the present invention can fabricate a high-quality vertical transistor.

DETAILED DESCRIPTION OF THE PREFERRED EMBODIMENTS

Figure 1:
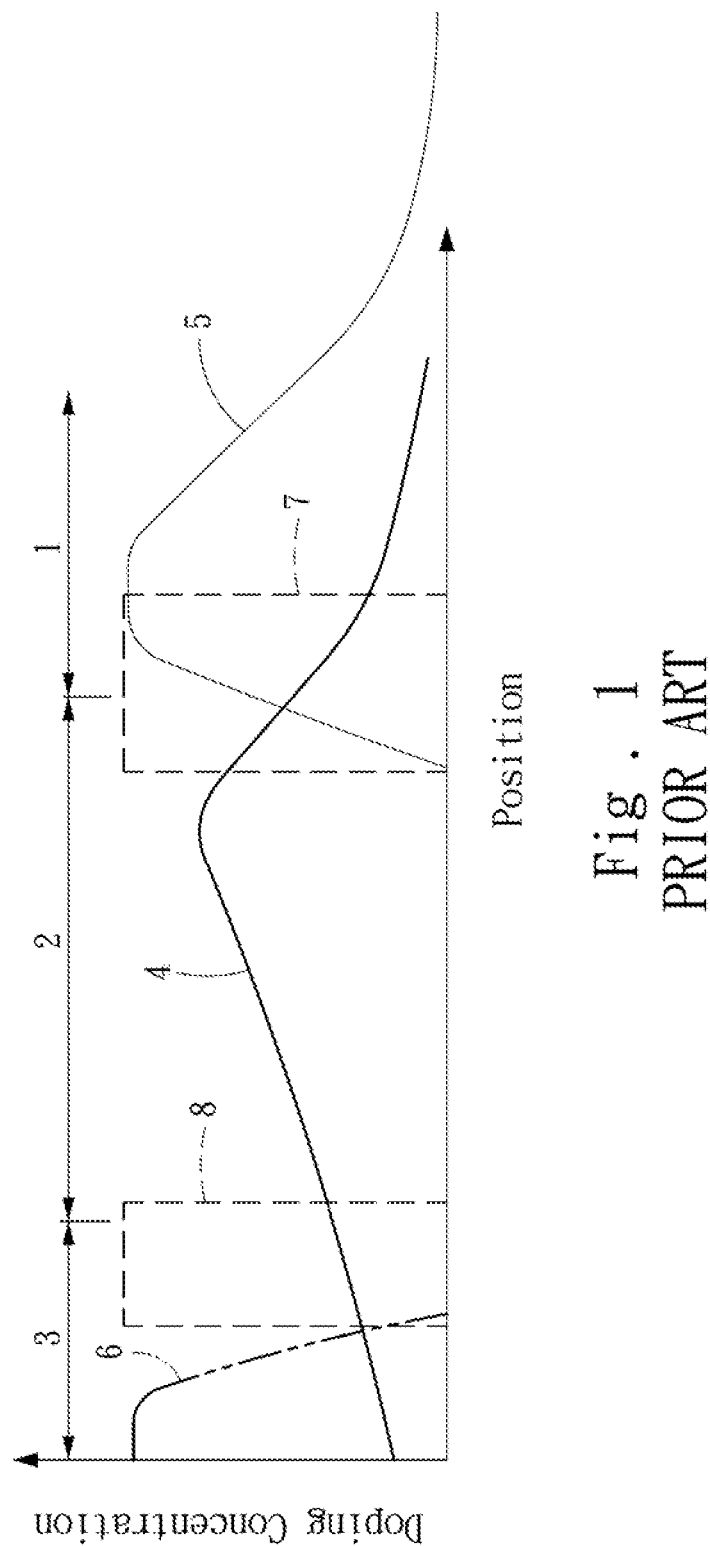
FIG. 1 schematically shows the ion concentration distributions of a conventional vertical transistor.

The technical contents of the present invention are described in detail in cooperation with drawings below.

Refer to FIGS. 2A-2J. The present invention proposes a method for fabricating a vertical transistor, which comprises the following steps.

Step S1: forming trenches. Define at least one trench region 13 and at least one insulation region 14 in a substrate 10, and form a first trench 12 in each trench region 13. A process to fabricate a transistor array, especially a process to fabricate DRAM, is used to exemplify the method of the present invention. In one embodiment, the substrate 10 has a plurality of trench regions 13 and a plurality of insulation regions 14, and the trench regions 13 and the insulation regions 14 are alternately arranged in the substrate 10. In detail, Step S1 further comprises Step S1a and Step S1b.

Figure 2A:
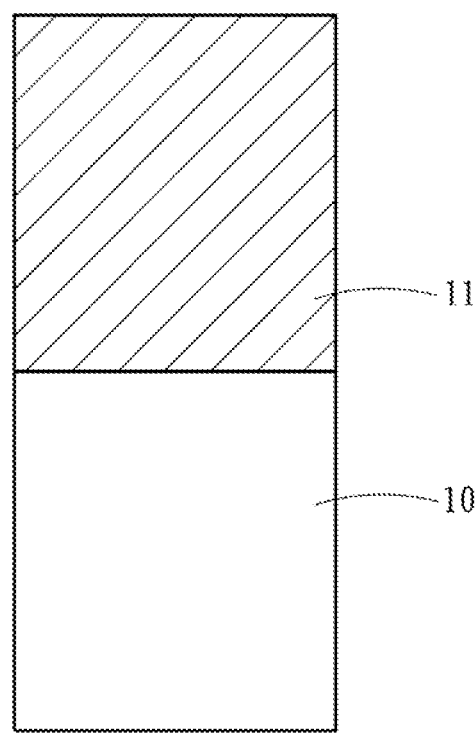
FIGS. 2A-2J are sectional views schematically showing the first-stage process of a method for fabricating a vertical transistor according to one embodiment of the present invention.

Step S1a: forming an extension layer 11 on the substrate 10, as shown in FIG. 2A. In one embodiment, the extension layer 11 is made of an insulating oxide; the substrate 10 is made of silicon.

Figure 2B:
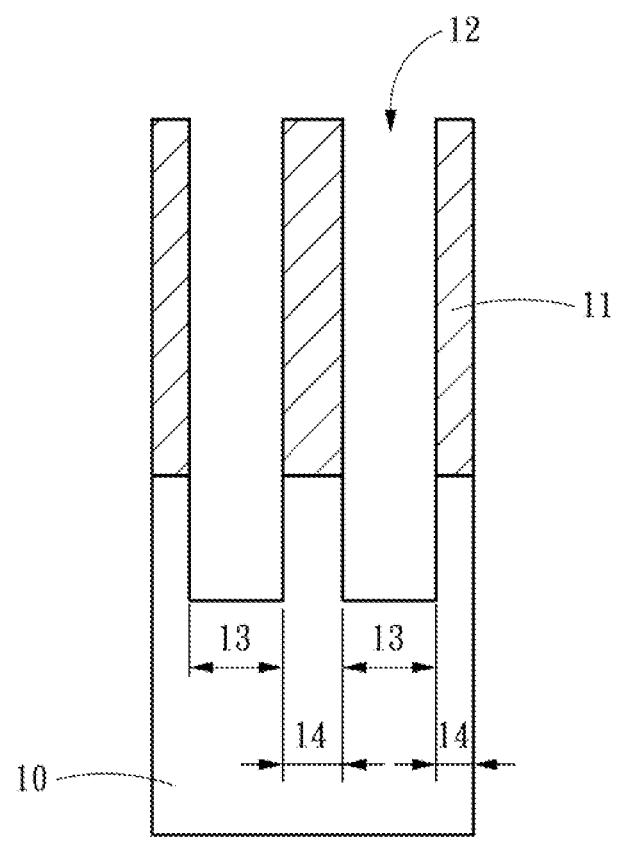

Step S1b: etching the extension layer 11 and the substrate 10 to form the first trenches 12, as shown in FIG. 2B. Thus, the substrate 10 has a plurality of parallel trenches 12 corresponding to the trench regions 13 and completely penetrating the extension layer 11.

Figure 2C:
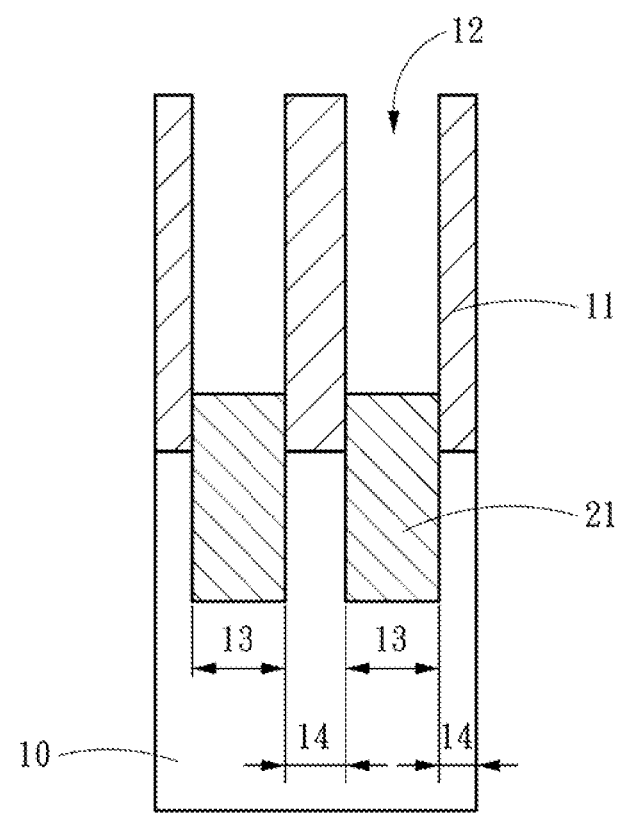
Figure 2D:
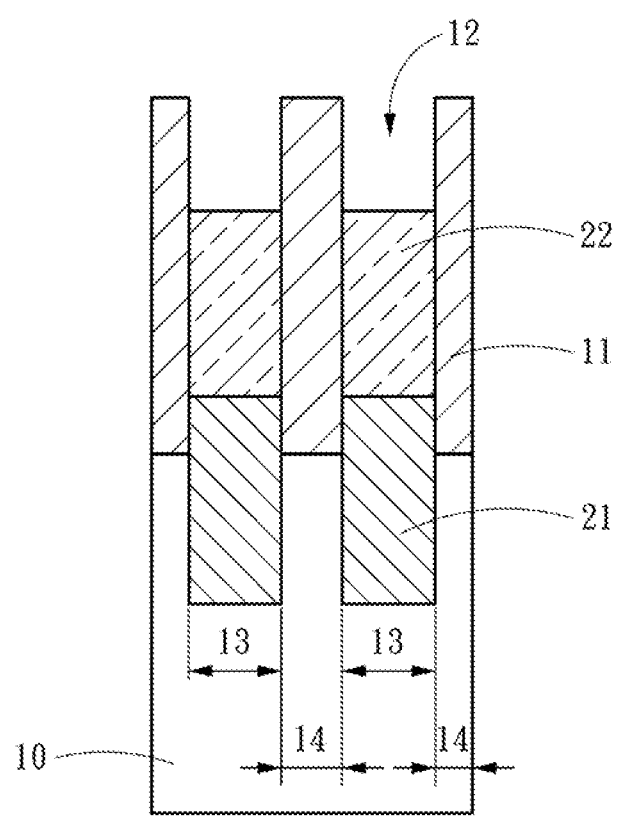
Figure 2E:
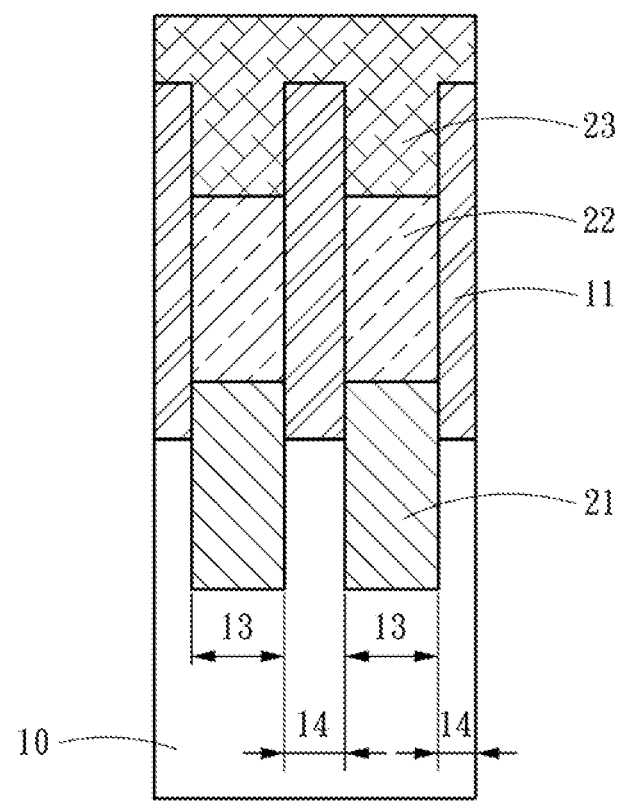
Figure 2F:
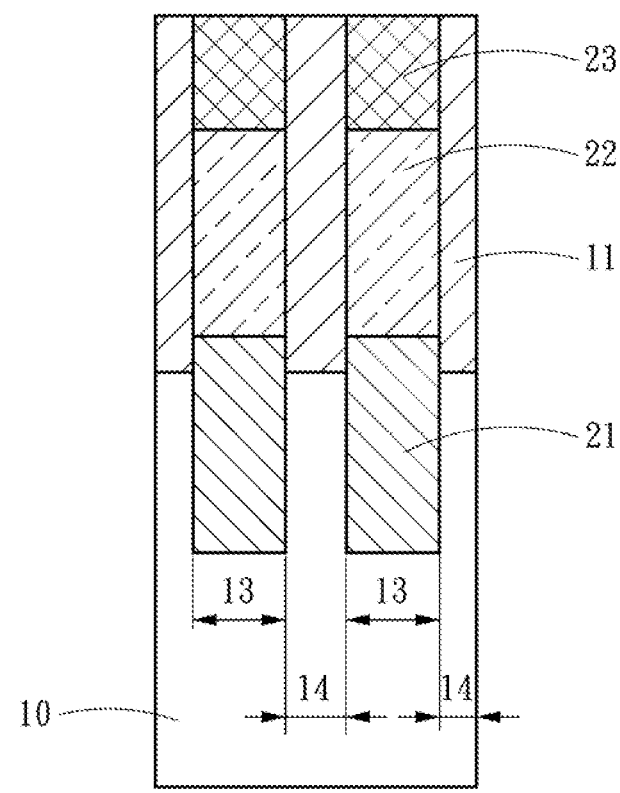

Step S2: epitaxially growing. Refer to FIG. 2C and FIG. 2D. A first polarity layer 21 and a channel layer 22 are sequentially formed inside the first trenches 12 by an epitaxial method. It should be noted that the material of the epitaxial layers is not pure silicon but doped with P-type or N-type ions. Therefore, the first polarity layer 21 and the channel layer 22 have uniform ion concentration distribution. Depending on the desired transistor type, the material of the first polarity layer 21 is doped with P-type or N-type ions. Contrarily, the material of the channel layer 22 is doped with N-type or P-type ions. Refer to FIG. 2E. A first retard layer 23 made of silicon nitride is formed over the channel layer 22. Refer to FIG. 2F. The first retard layer 23 is ground to the same level as the extension layer 11 with a CMP (Chemical Mechanical Polishing) method.

Figure 2G:
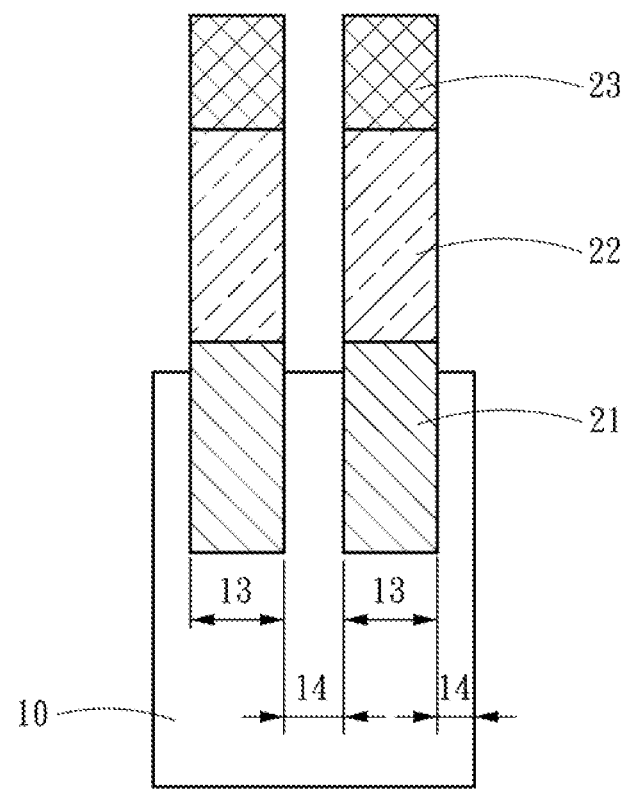
Figure 2H:
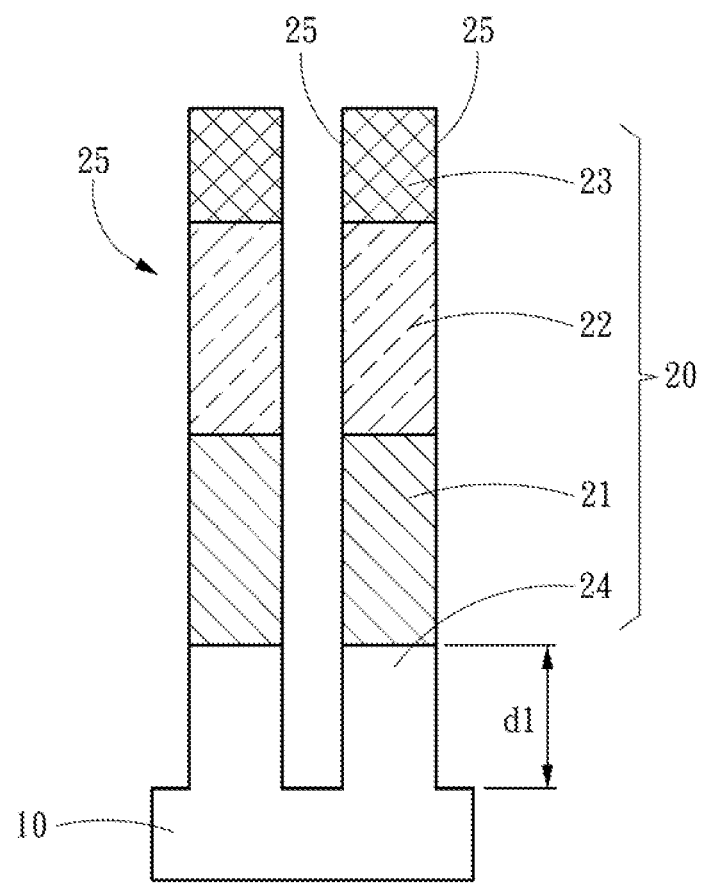

Step S3: etching the substrate 10. Refer to FIG. 2G and FIG. 2H. The extension layer 11 and the substrate 10 above the insulation regions 14 are etched with the first retard layer 23 as the mask until the top of the etched region is lower than the top of the first polarity layer 21 by an etch depth of d1 so as to form a connection portion 24 connected with the first polarity layer. The combination of the connection portion 24, the first polarity layer 21, the channel layer 22 and the first retard layer 23 which stack together is defined as an integration layer 20. Thus, a substrate 10 has a plurality of integration layers 20, and each integration layer 20 has two opposite side faces 25.

Figure 2I:
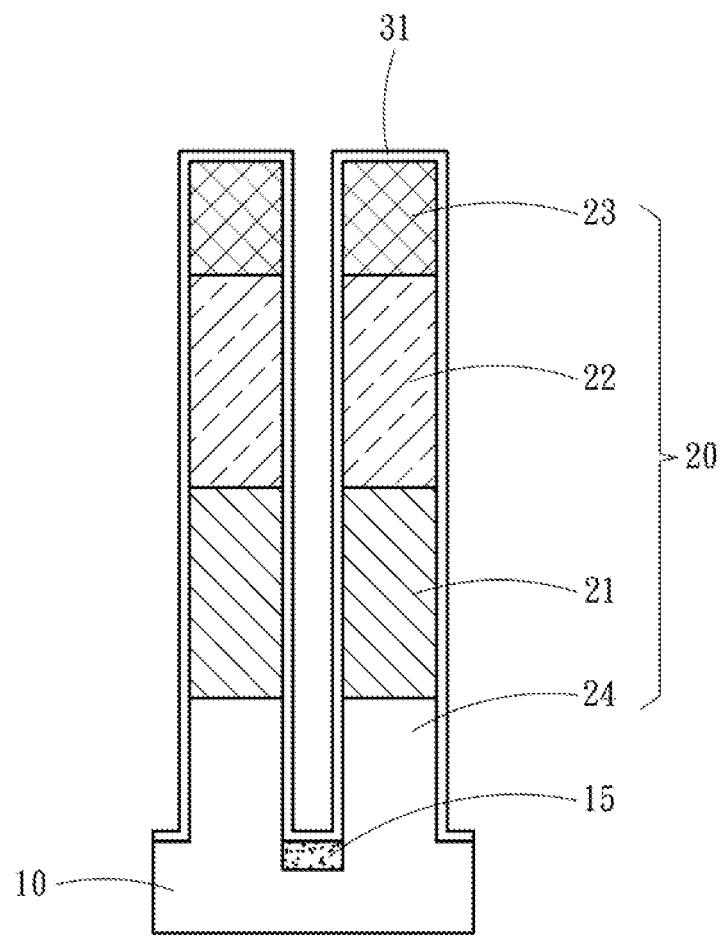

Refer to FIG. 2I. In order to facilitate the succeeding steps is undertaken Step A1: using an ISSG (In Situ Steam Generation) technology to repair the two side faces 25 and form a repair layer 31 on the surface of the integration layer 20, whereby is flattened the side faces 25. Besides may be undertaken Step A2: implanting a plurality of counter ions 15 having a polarity opposite to that of a plurality of doped ions of the first polarity layer 21 into the regions of the substrate 10, which are between each two adjacent integration layers 20, which can enhance the insulation between each two adjacent integration layers 20 and prevent from electric conduction between each two adjacent integration layers 20 lest the interference therebetween cause signal distortion or signal loss.

Figure 2J:
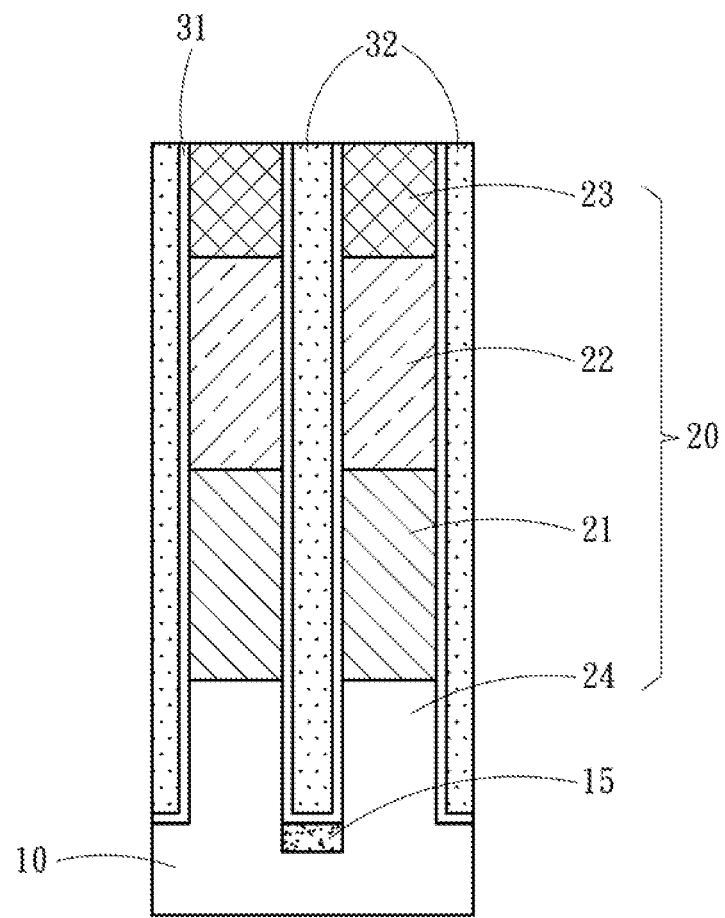

Step S4: forming a first insulation layer 32. Refer to FIG. 2J. In one embodiment, an insulating material 64 is filled between each two adjacent integration layers 20 with an SOD (Spin on Dielectric) technology to form a first insulation layer 32 on the side faces 25.

Figure 3:
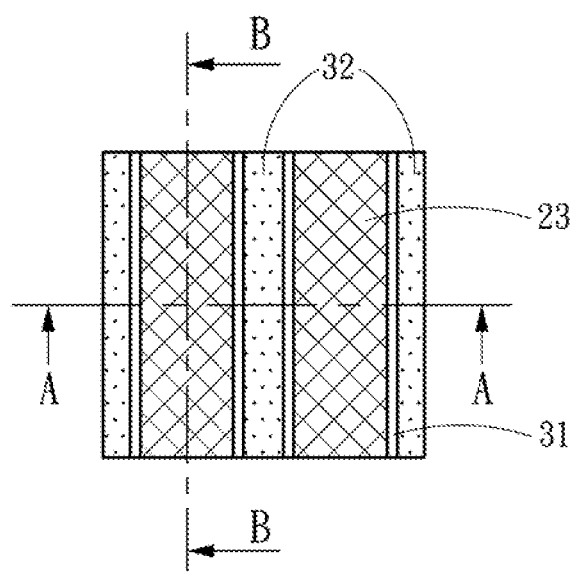
FIG. 3 is a top view of the structure shown in FIG. 2J.

After the abovementioned steps is completed the first-stage process, i.e. completed the process for fabricating the first polarity layer 21 and the channel layer 22. Refer to FIG. 3 a top view schematically showing the structure completed in the first-stage process. FIGS. 2A-2J are sectional views taken along Line A-A in FIG. 3 for the first-stage process. Next refer to FIGS. 4A-4G sectional views taken along Line B-B in FIG. 3 for the second-stage process.

Figure 4A:
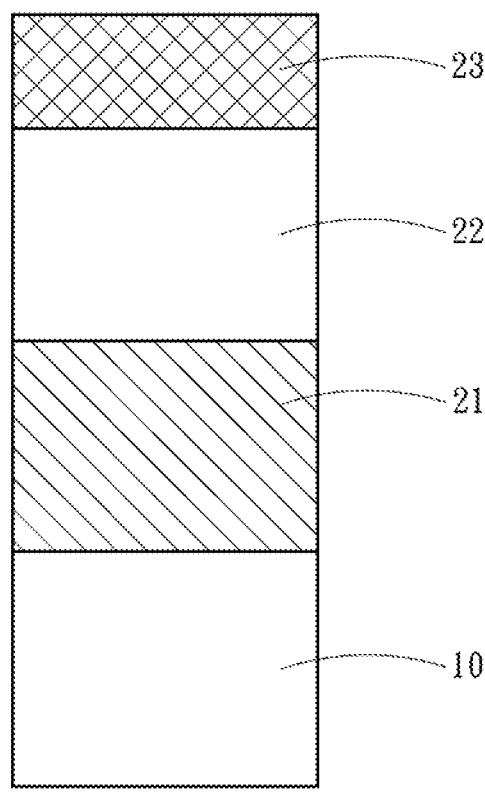
FIGS. 4A-4G are sectional views schematically showing the second-stage process of a method for fabricating a vertical transistor according to one embodiment of the present invention.
Figure 4B:
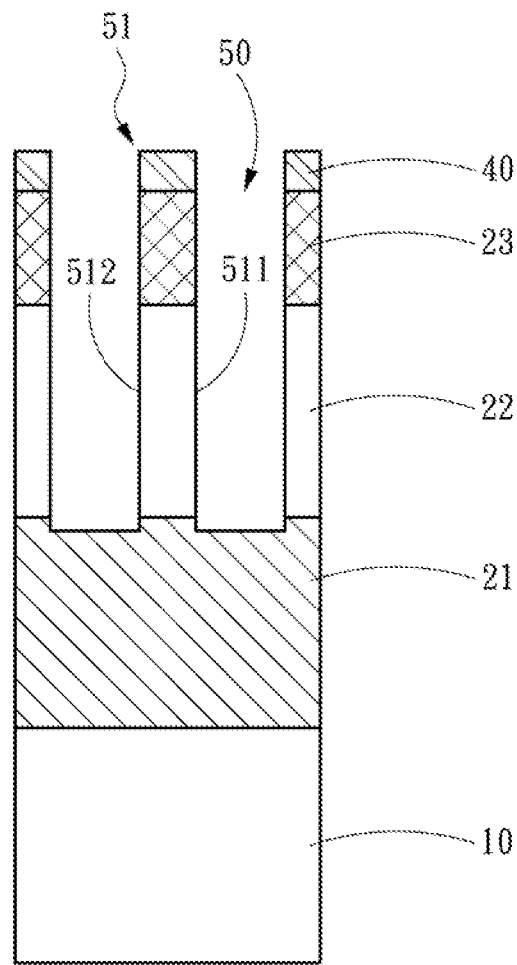
Figure 5:
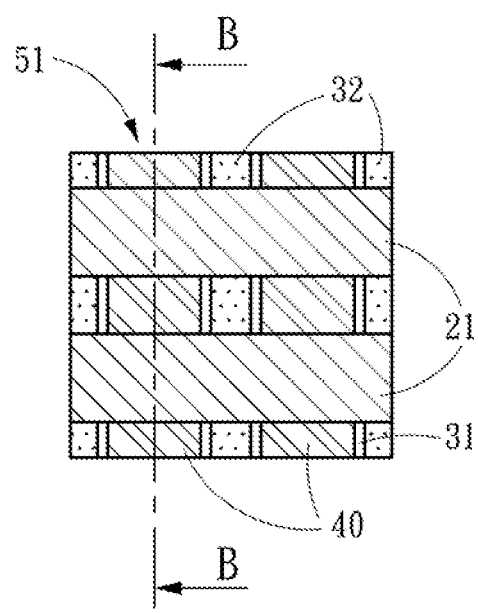
FIG. 5 is a top view of the structure shown in FIG. 4B.

Step S5: forming a plurality of second trenches 50 in the integration layers 20 to form at least one pillar 51. Refer to FIG. 4A, FIG. 4B and FIG. 5. FIG. 4A is a sectional view along Line B-B in FIG. 3. FIG. 5 is a top view of the structure shown in FIG. 4B. As shown in FIG. 4B, a second retard layer 40 is formed over the first retard layer 23 to define the etched regions. The integration layer 20 is etched with the second retard layer 40 being the mask until the channel layer 22 exactly below the second retard layer 40 is completely removed with the first polarity layer 21 being preserved. Thereby, a plurality of second trenches 50 is formed on the substrate 10. The lengthwise direction of the second trenches 50 is vertical to that of the first trenches 12. The unetched regions between the first trenches 12 and the second trenches 50 thus become a plurality of pillars 51. Each pillar 51 has a first sidewall 511 and a second sidewall 512 respectively facing two adjacent second trenches 50.

Figure 4C:
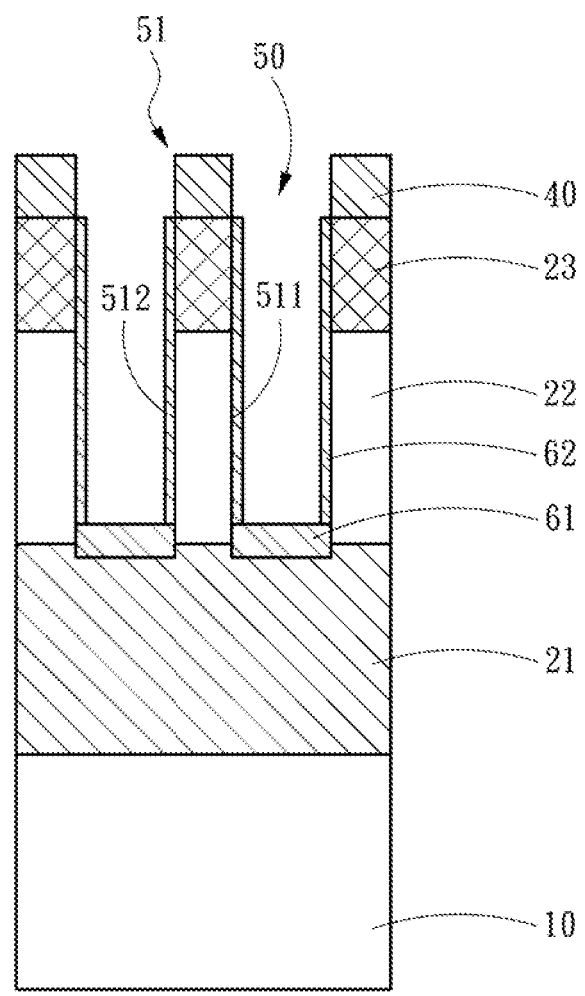

After Step S5 is undertaken Step A3: forming an insulating protection structure. Refer to FIG. 4C. A protection layer 61 is formed at the bottom of each second trench 50, and a second insulation layer 62 is formed on each of the first sidewalls 511 and the second sidewalls 512, whereby the succeeding process neither affects the substrate 10, the first sidewall 511 and the second sidewall 522 nor causes leakage current. In one embodiment, the second insulation layer 62 is formed with an ISSG technology.

Figure 4D:
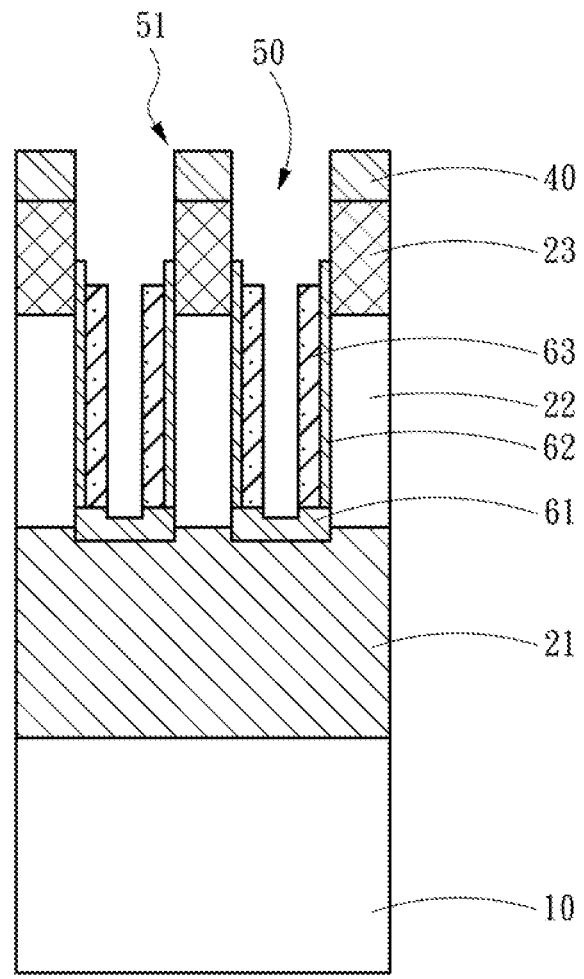

Step S6: respectively forming a gate 63 on the first sidewall 511 and the second sidewall 512, as shown in FIG. 4D. In one embodiment, the second insulation layer 62 is interposed between the gate 63 and the first/second sidewall 511/512, whereby the electric conduction between the gate 63 and the pillar 51 would not occur. In one embodiment, a conductive material is filled into the second trench 50, and then an etching process together with a photoresist is used to partition off the insulting material and form two gates 63 respectively attaching to the first sidewall 511 and the second sidewall 512. In one embodiment, a conductive layer is deposited on the bottom and the sidewalls of the second trench 50 with a line-of-sight deposition method, and then the conductive layer on the bottom of the second trench 50 is removed with an etch-back method, whereby two gates 63 are portioned off and respectively attach to the first sidewall 511 and the second sidewall 512. It should be mentioned that the thickness of the protection layer 61 on the bottom of the second trench 50 can be used to adjust the relative position of the gate 63 and the first polarity layer 21.

Figure 4E:
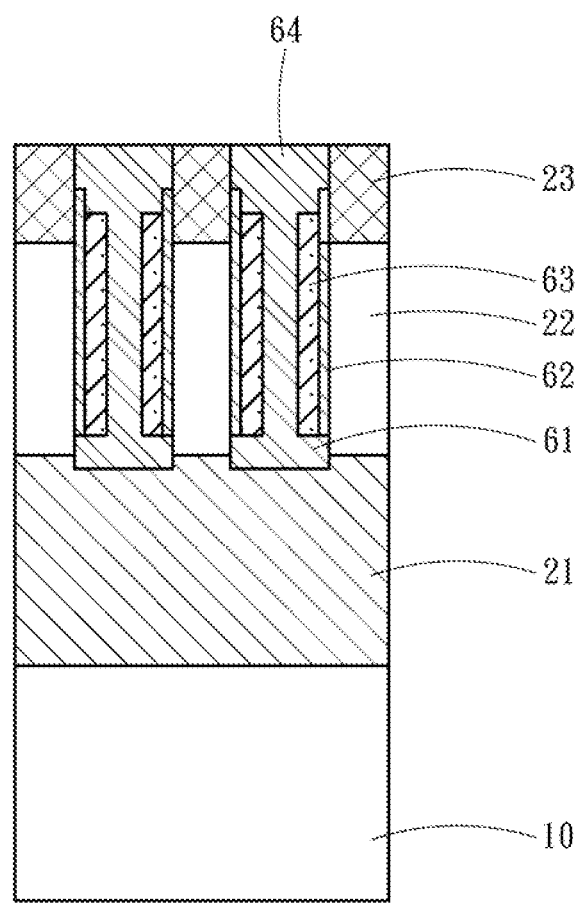

After Step S6 is undertaken Step A4: filling an insulating material 64 into the second trench 50 containing gates 63 on the sidewalls thereof, as shown in FIG. 4E. Thereby is completely excluded the possibility of electric conduction between two gates 63 on the first sidewalls 511 and the second sidewalls 512 of each second trench 50. Further is also excluded the possibility that the external environment affects the gates 63.

Figure 4F:
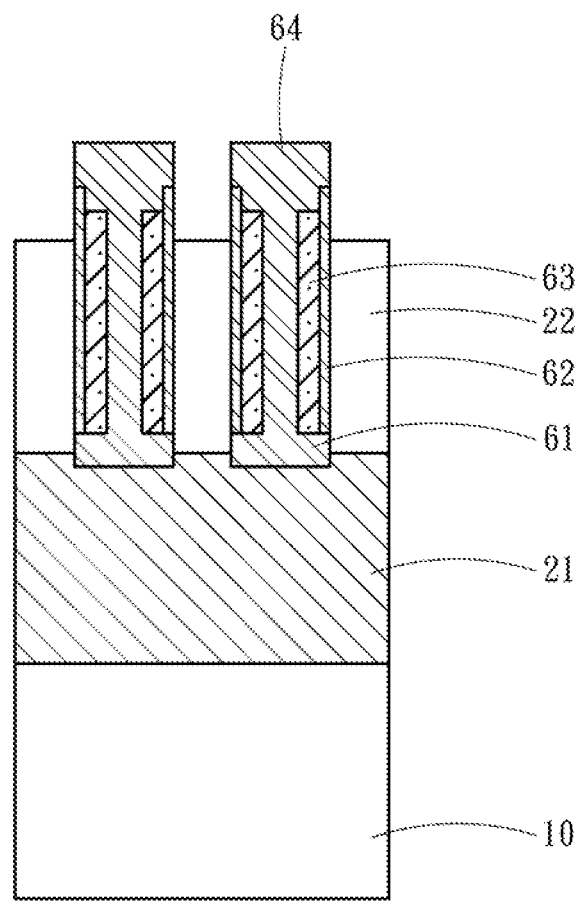

Step S7: removing the first retard layer 23 on the pillar 51, as shown in FIG. 4F.

Figure 4G:
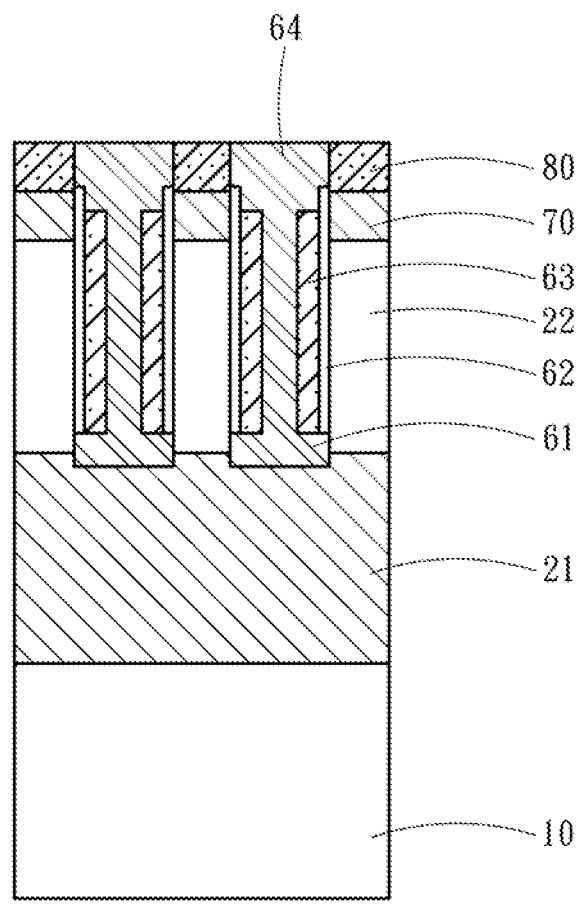

Step S8: epitaxially growing a second polarity layer 80 on the pillar 51. Refer to FIG. 4G and FIG. 2G. The material of the second polarity layer 80 is the same as the first polarity layer 21. The first polarity layer 21, the channel layer 22, the second polarity layer 80 and the gates 63 in the pillar 51 thus form a vertical transistor. The first polarity layer 21 and the second polarity layer 80 respectively function as the source and the drain of the vertical transistor. The voltages of the gates 63 controls the electric conduction state of the channel layer 22 and thus determines the electric connection state between the first polarity layer 21 and the second polarity layer 80.

Between Step S7 and Step S8 may be undertaken Step A5: forming a height adjusting layer 70 on the channel layer 22. Thus, the height adjusting layer 70 is interposed between the channel layer 22 and the second polarity layer 80. In one embodiment, the height adjusting layer 70 is made of the same material as the channel layer 22 or silicon. In other words, the height adjusting layer 70 is made of pure silicon or lightly-doped N-type silicon. In one embodiment, the height adjusting layer 70 is formed via epitaxial growth.

It should be particularly explained that the height adjusting layer 70 is used to modify the relative position of the second polarity layer 80 and the gate 63. If the top end of the gate 63 is higher than the second polarity layer 80 and the height adjusting layer 70, leakage current is likely to occur. If the top end of the gate 63 is far below the second polarity layer 80 and the height adjusting layer 70, the electric conduction state of the channel layer 22, which is enabled by the gates 63, cannot effectively reach the second polarity layer 80. In such a case, it is unlikely to switch the transistor.

In conclusion, the present invention uses an epitaxial technology to form the first polarity layer 21, the channel layer 22 and the second polarity layer 80 and thus has the advantage of uniform ion concentration distribution. Further, the present invention uses the protection layer 61 and the height adjusting layer 70 to modify the relative positions of the gate 63, the first polarity layer 21 and the second polarity layer 80 lest the gate 63 cannot switch the vertical transistor. Thereby, the present invention realizes a high-quality vertical transistor. Therefore, the present invention possesses utility, novelty and non-obviousness and meets the condition for a patent. Thus, the Inventors file the application for a patent. It is appreciated if the patent is approved fast.

The present invention has been demonstrated in detail with the embodiments. However, the embodiments described above are only to exemplify the present invention but not to limit the scope of the present invention. Any equivalent modification or variation according to the spirit of the present invention is to be also included within the scope of the present invention.

What is claimed is:

1. A method for fabricating a vertical transistor, comprising the steps of:
   Step S1: defining at least one trench region and at least one insulation region in a substrate, and forming a first trench in each trench region;
   Step S2: sequentially epitaxially growing a first polarity layer and a channel layer inside each first trench, and forming a first retard layer on the channel layer;
   Step S3: etching the insulation region with the first retard layer being a mask until a top of the insulation region is lower than a top of the first polarity layer by an etch depth so as to form a connection portion connected with the first polarity layer, and defining a combination of the connection portion, the first polarity layer, the channel layer and the first retard layer which stack together as an integration layer, wherein the integration layer has two opposite side faces;
   Step S4: forming a first insulation layer on each side face;
   Step S5: forming a plurality of second trenches in the integration layers to form at least one pillar each having a first sidewall and a second sidewall, wherein the integration layer is etched until the channel layer is completely removed with the first polarity layer being preserved to form the second trenches, and wherein a lengthwise direction of the second trenches is vertical to that of the first trenches;
   Step S6: respectively forming a gate on the first sidewall and the second sidewall;
   Step S7: removing the first retard layer on the pillar; and
   Step S8: epitaxially growing a second polarity layer on the pillar.

2. The method for fabricating a vertical transistor according to claim 1, wherein Step S1 further comprises the steps of:
   Step S1a: forming an extension layer on the substrate; and
   Step S1b: etching the extension layer and the substrate to form the first trenches.

3. The method for fabricating a vertical transistor according to claim 2, wherein the extension layer is made of an oxide.

4. The method for fabricating a vertical transistor according to claim 2, wherein the extension layer is also completely removed in Step S3.

5. The method for fabricating a vertical transistor according to claim 1, wherein between Step S3 and Step S4 is undertaken Step A1: using an ISSG (In Situ Steam Generation) technology to repair and flatten the two side faces.

6. The method for fabricating a vertical transistor according to claim 1, wherein in Step S4, an insulating material is filled between two adjacent integration layers to form the first insulation layer.

7. The method for fabricating a vertical transistor according to claim 1, wherein the trench regions and insulation regions are multiple and which are alternately arranged in the substrate, and wherein the first trenches are multiple and correspond to the trench regions, and the first trenches are parallel to each other, and wherein the integration layers are multiple and correspond to the trench regions.

8. The method for fabricating a vertical transistor according to claim 7, wherein between Step S3 and Step S4 is undertaken Step A2: implanting a plurality of counter ions having a polarity opposite to that of a plurality of dope ions of the first polarity layer into regions of the substrate, which are between each two adjacent integration layers.

9. The method for fabricating a vertical transistor according to claim 7, wherein between Step S5 and Step S6 is undertaken Step A3: forming a protection layer at the bottom of each second trench, and forming a second insulation layer on each of the first sidewalls and the second sidewalls.

10. The method for fabricating a vertical transistor according to claim 1, wherein after Step S6 is undertaken Step A4: filling an insulating material into the second trench having the gates.

11. The method for fabricating a vertical transistor according to claim 1, wherein between Step S7 and Step S8 is undertaken Step A5: forming a height adjusting layer between the channel layer and the second polarity layer.

12. The method for fabricating a vertical transistor according to claim 11, wherein the height adjusting layer is made of a material identical to that of the channel layer or made of silicon.

13. The method for fabricating a vertical transistor according to claim 11, wherein the height adjusting layer is formed by an epitaxial method.

* * * * *